(12) United States Patent
Chang et al.

(10) Patent No.: US 11,675,949 B2
(45) Date of Patent: Jun. 13, 2023

(54) SPACE OPTIMIZATION BETWEEN SRAM CELLS AND STANDARD CELLS

(71) Applicant: Taiwan Semiconductor Manufacturing Company, Ltd., Hsinchu (TW)

(72) Inventors: Feng-Ming Chang, Zhubei (TW); Ruey-Wen Chang, Hsinchu (TW); Ping-Wei Wang, Hsinchu (TW); Sheng-Hsiung Wang, Zhubei (TW); Chi-Yu Lu, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 198 days.

(21) Appl. No.: 16/722,865

(22) Filed: Dec. 20, 2019

(65) Prior Publication Data

US 2020/0272781 A1    Aug. 27, 2020

Related U.S. Application Data

(60) Provisional application No. 62/808,506, filed on Feb. 21, 2019.

(51) Int. Cl.
*H01L 27/146* (2006.01)
*G06F 30/392* (2020.01)
(Continued)

(52) U.S. Cl.
CPC .......... *G06F 30/392* (2020.01); *G06F 30/398* (2020.01); *H01L 27/0886* (2013.01); *H01L 27/1104* (2013.01)

(58) Field of Classification Search
CPC ................ G06F 30/392; G06F 39/398; H01L 27/0886; H01L 27/1104; H01L 27/0207; H01L 27/1116
(Continued)

(56) References Cited

U.S. PATENT DOCUMENTS 7,995,366 B2     8/2011    Ostermayr et al.
9,047,433 B2 *   6/2015    Yang ................... G06F 30/392
(Continued)

FOREIGN PATENT DOCUMENTS

CN       103778273 A     5/2014
CN       104009032 A     8/2014
(Continued)

OTHER PUBLICATIONS

Merriam-Webster Online Dictionary Definition of "laying out." No Date.*

*Primary Examiner* — Hrayr A Sayadian

(74) *Attorney, Agent, or Firm* — Slater Matsil, LLP

(57) ABSTRACT

A method includes laying out a standard cell region, with a rectangular space being within the standard cell region. The standard cell region includes a first row of standard cells having a first bottom boundary facing the rectangular space, and a plurality of standard cells having side boundaries facing the rectangular space. The plurality of standard cells include a bottom row of standard cells. A memory array is laid out in the rectangular space, and a second bottom boundary of the bottom row and a third bottom boundary of the memory array are aligned to a same straight line. A filler cell region is laid out in the rectangular space. The filler cell region includes a first top boundary contacting the first bottom boundary of the first row of standard cells, and a fourth bottom boundary contacting a second top boundary of the memory array.

20 Claims, 14 Drawing Sheets

(51) Int. Cl.
  *H01L 27/088* (2006.01)
  *G06F 30/398* (2020.01)
  *H01L 27/11* (2006.01)
(58) Field of Classification Search
  USPC ........................................................ 257/204
  See application file for complete search history.

(56) References Cited

U.S. PATENT DOCUMENTS

| | | | |
|---|---|---|---|
| 10,635,775 | B2 | 4/2020 | Lee et al. |
| 10,651,313 | B2 | 5/2020 | Huang et al. |
| 10,679,980 | B2 | 6/2020 | Lo et al. |
| 10,818,676 | B2 | 10/2020 | Liaw |
| 11,094,685 | B2 | 8/2021 | Liaw |
| 11,488,966 | B2 | 11/2022 | Liaw |
| 2005/0044522 | A1 | 2/2005 | Maeda |
| 2009/0317749 | A1 | 12/2009 | Lee |
| 2012/0087184 | A1 | 4/2012 | Lee et al. |
| 2015/0243667 | A1 | 8/2015 | Liaw |
| 2017/0116366 | A1 | 4/2017 | Seo et al. |
| 2019/0012423 | A1 | 1/2019 | Lee et al. |

FOREIGN PATENT DOCUMENTS

| | | |
|---|---|---|
| CN | 108122916 A | 6/2018 |
| CN | 108735747 A | 11/2018 |
| DE | 102010037216 A1 | 3/2011 |
| DE | 102017110226 A1 | 1/2018 |
| DE | 102017125036 A1 | 5/2018 |
| KR | 20140107083 A | 9/2014 |
| KR | 20190004576 A | 1/2019 |
| TW | 201820620 A | 6/2018 |
| TW | I638432 B | 10/2018 |
| TW | I644400 B | 12/2018 |

\* cited by examiner

SPACE OPTIMIZATION BETWEEN SRAM CELLS AND STANDARD CELLS

PRIORITY CLAIM AND CROSS-REFERENCE

This application claims the benefit of the U.S. Provisional Application No. 62/808,506, filed Feb. 21, 2019, and entitled "Space Optimization Between SRAM and Standard Cell" which application is hereby incorporated herein by reference.

BACKGROUND

Memory cells, which are typically in the form of memory arrays, are often formed on the same chip as standard cells. The standard cells may include the cells of logic circuits that use the memory cells. A commonly used memory cell is Static Random Access Memory (SRAM) cell. Conventionally, due to design rules and process reasons, SRAM cells cannot abut standard cells directly, and a white space needs to be reserved between the SRAM cells and the nearest standard cells. The white space is greater than the total cell heights of a plurality of standard cells. Accordingly, conventional circuits are not cost effective in chip area usage.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
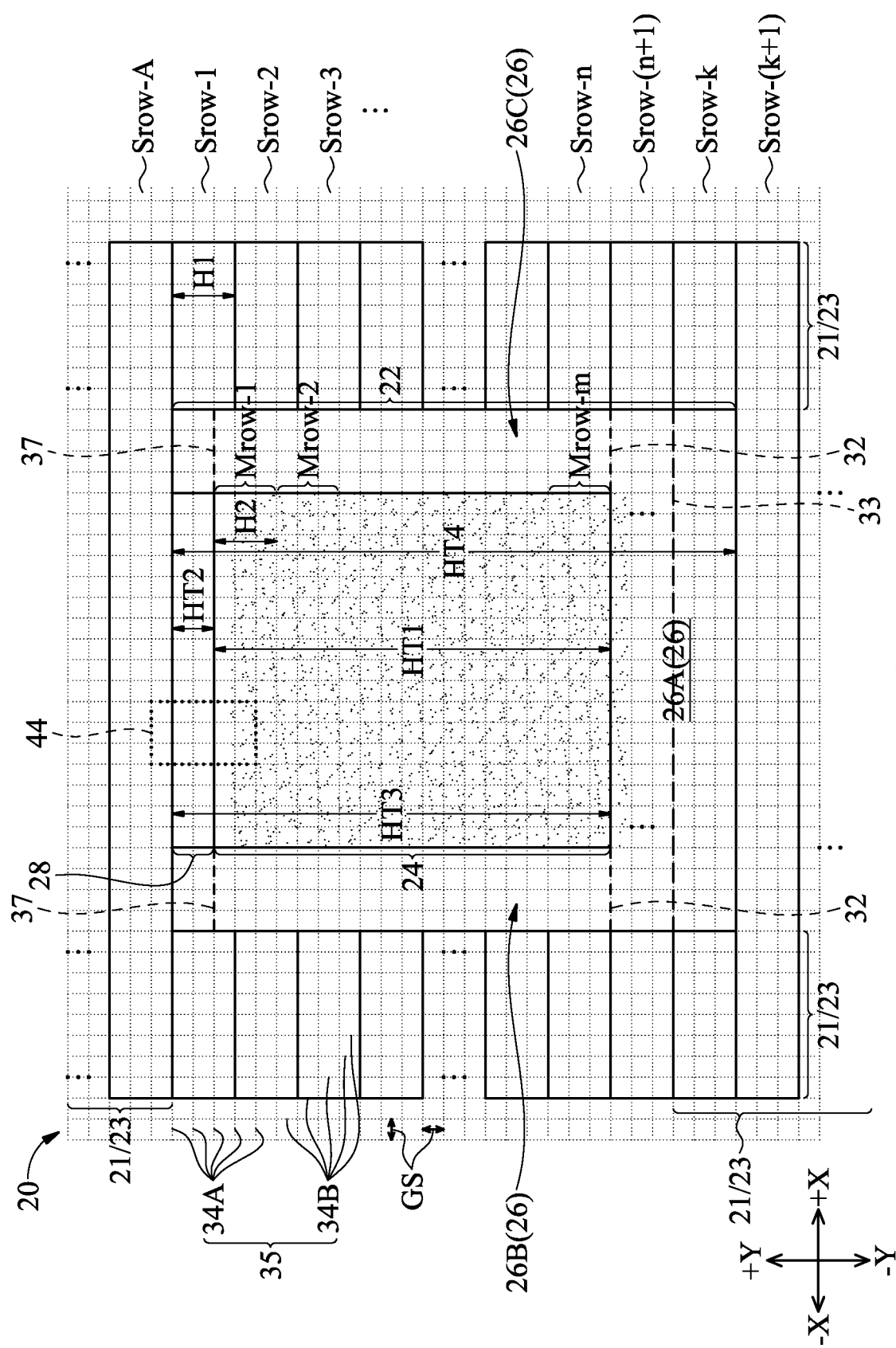
FIG. 1 illustrates a schematic view of device regions in a circuit in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated circuit including memory cells and standard cells (logic cells) and the method of laying out the same are provided in accordance with some embodiments. Some variations of some embodiments are discussed. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements.

In accordance with some embodiments of the present disclosure, an integrated circuit is designed. The integrated circuit includes standard cells arranged as a plurality rows, and a memory array formed in a region encircled by the standard cells. Filler cells are arranged as one or a plurality of rows, and are allocated between the memory cells and a nearest row of standard cells. The heights of the filler cells may be as small as possible, providing that design rules and process rules are not violated, which is to ensure the processes for forming the circuit on physical wafers may be performed successfully with acceptable process margin. A set of filler cells having different heights is designed and formed. A method of calculating and selecting the heights for optimal filler cells is provided. It is appreciated that although Static Random Access Memory (SRAM) cells are used as an example to discuss the concept of the present application, the concept may be applied to other types of memory cells such as Magneto Resistive Random Access (MRAM) cells, Dynamic Random Access Memory (DRAM) cells, or the like.

Throughout the description, the directions of the rows of cells are shown as being in the X-directions (including +X and −X directions), and the directions of the columns of cells are in the Y-directions (including +Y and −Y directions). Also, a boundary of a region or a cell in the +Y direction is referred to as the top boundary, and a boundary of a region or a cell in the −Y direction is referred to as the bottom boundary. Correspondingly, the +Y side is referred to as the upper or top side, and −Y side is referred as the lower or bottom side. Accordingly, when a first feature is on the +Y side of a second feature, the first feature is referred to as being "over" or "above" the second feature, and the second feature is referred to as being "under" or "below" the first feature. The dimension of a region or a cell in the Y directions is referred to as the height of the cell or region. Also, when a first feature is referred to as "horizontally aligned" to a second feature, it means the first feature and the second feature have a same Y-direction coordinate. When a first feature is referred to as "vertically aligned" to a second feature, it means the first feature and the second feature have a same X-direction coordinate.

FIG. 1 illustrates a schematic view of integrated circuit region 20. Integrated circuit region 20 includes a plurality of standard cells 23. In accordance with some embodiments, the standard cells 23 are also referred to as logic cells or core cells. The standard cells may include basic cells such NOR gates, NAND gates, inverters, and the like and composite cells that are formed using the basic cells. The layouts of standard cells are saved in a cell library.

A memory macro 22 is to be allocated in integrated circuit region 20, and is encircled by standard cells, which include standard cell row Srow-A and standard cell rows Srow-1 through Srow-(k+1). The standard cells encircling memory macro 22 include standard cells 23, which are collectively referred to as standard cell region 21. Memory macro 22 includes memory array 24, SRAM peripheral 26 (including portions 26A, 26B, and 26C), and filler cell region 28. Memory array 24 is allocated as a plurality of rows and a plurality of columns of SRAM cells. The total number of the rows of the SRAM array 24 is m, which is an integer. The rows of the SRAM cells are thus denoted as Mrow-1, Mrow-2 . . . through Mrow-m. Integer m may be the multiples of 2, and may be a number selected from, for example, 64, 128, 256, 512, 1024, and so on. SRAM peripheral region 26 may include portion 26A on the bottom side, portion 26B on the left side, and portion 26C on the right side of SRAM array 24, as shown in FIG. 1.

SRAM macro 22 expands through k rows of standard cells, and fits in standard cell rows Srow-1 through Srow-k, with k being an integer. As shown in FIG. 1, standard cell rows Srow-1 through Srow-k include standard cells 23 on the left side and the right side of SRAM macro 22. Standard cell row Srow-A is over SRAM macro 22, and abuts SRAM macro 22. Standard cells row Srow-(k+1) is below SRAM macro 22, and also abuts SRAM macro 22. SRAM Marco 22 fits tightly in the rows of standard cells 23. Accordingly, the top boundary of SRAM macro 22 is horizontally aligned to the top boundary of standard row Srow-1, and the bottom boundary of SRAM macro 22 is horizontally aligned to the bottom boundary of standard row Srow-k.

SRAM peripheral 26 may include, for example, word line encoders, word line drivers, sense amplifiers, or the like. In accordance with some embodiments, SRAM peripheral 26 may be treated as standard circuits, and may have standard cells therein. The cell height of a row of the cells in SRAM peripheral 26 may be the same as the cell height of a row of standard cells 23. Also, each row of the cells in SRAM peripheral 26 may be horizontally aligned to a row of standard cells 23. Accordingly, the portion 26A of SRAM peripheral 26 has a top boundary horizontally aligned to the top boundary of standard cell row Srow-(n+1). This also means that filler cell region 28 and SRAM array 24 in combination fit into n rows of standard cells 23, with the bottom boundary of SRAM array 24 being aligned to the bottom boundary of standard cell row Srow-n. The alignment is denoted with dashed line 32. The corresponding rows of standard cells that are horizontally aligned to SRAM array 24 and filler cell region 28 are denoted as Srow-1 through Srow-n.

Filler cell region 28 is formed between SRAM array 24 and standard cell row Srow-A. Filler cell region 28 has a top boundary abutting the bottom boundary of standard cell row Srow-A, and a bottom boundary abutting the top boundary of SRAM array 24. The filler cells in filler cell region 28 may or may not have electrical functions. The design of the filler cells in filler cell region 28 is discussed in detail in subsequent paragraphs. In accordance with some embodiments of the present disclosure, the left boundary of filler cell region 28 is flushed with the left boundary of SRAM array 24, and the right boundary of filler cell region 28 is flushed with the right boundary of SRAM array 24. Furthermore, filler cell region 28 includes a plurality of columns of filler cells, and the columns of the filler cells in filler cell region 28 may have the same width as, and may be vertically aligned to, the columns of SRAM cells in SRAM array 24.

FIG. 1 illustrates a design grid 35, which is formed of horizontal grid lines 34A and vertical grid lines 34B. Grid lines 34A may have a uniform grid spacing, which is the distance between neighboring grid lines 34A. Grid lines 34B may also have a uniform grid spacing, which is the distance between neighboring grid lines 34B. The grid spacing of grid lines 34A may be equal to the grid spacing of grid lines 34B. In accordance with some embodiments of the present disclosure, all of the circuit regions such as SRAM macro 22, SRAM array 24, filler cell region 28, and standard cell region 21, and the cells inside the circuit regions need to have their boundaries falling on grid lines 34A and 34B for design alignment. Accordingly, the cell heights and the lengths of the standard cells, the SRAM cells, and the filler cells are designed to be equal to the integer times of the grid spacing GS, as shown in FIGS. 2 through 11 as examples.

It is appreciated that the top boundary of SRAM array 24 may not directly abut to the bottom boundary of standard cell row Srow-A because this causes pattern conflict and design rule violation. Accordingly, filler cell region 28 is inserted. Filler cell region 28 may directly abut both of standard cell row Srow-A and SRAM array 24 without violating design rules. In addition, when the bottom boundary of SRAM array 24 is horizontally aligned to a bottom boundary of standard cell row Srow-n, the top boundary of SRAM array 24 may or may not be horizontally aligned to the top boundary of a standard cell row such as Srow-2. Rather, the top boundary of SRAM array 24 may be aligned to an intermediate level of a standard cell row, with the intermediate level being between the top boundary and the bottom boundary of the standard cell row, for example, as shown by dashed lines 37 in FIG. 1. This also means filler region 28 will be inserted to solve the problem of top-boundary misalignment between SRAM array 24 and standard cells 23.

Figure 2:
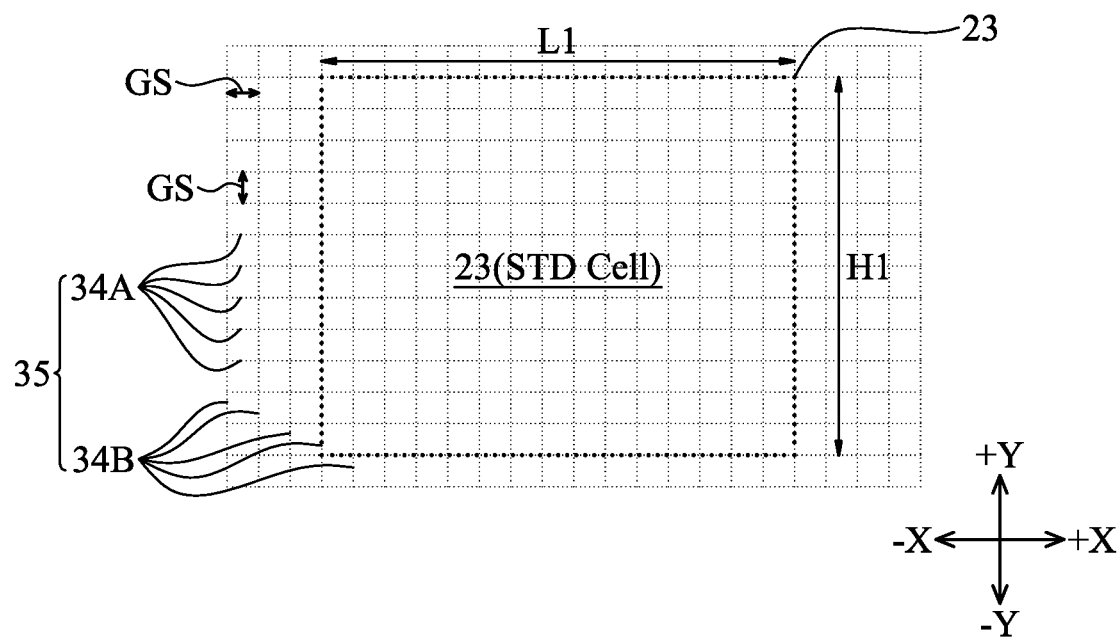
FIG. 2 illustrates boundaries of a standard cell corresponding to a design grid in accordance with some embodiments.

FIG. 2 illustrates the boundaries of standard (STD) cell 23 relative to grid 35. FIG. 2 shows that the boundaries (edges) of standard cell 23 fall on grid lines 34A and 34B. Accordingly, the height H1 of standard cell 23 is equal to integer times the grid spacing GS. Throughout the description, the heights of cells and regions are referred to relative to how many grid spacings GS they extend to. For example, when a cell extends through 15 grid spacings, the height of the cell is 15. Similarly, the length L1 of standard cell 23 is equal to integer times the grid spacing GS. It is appreciated that neighboring standard cells 23 (in FIG. 1) may have different lengths L1 even if they abut with each other. In accordance with some embodiments, standard cell 23 includes transistors therein. The transistors may be planar transistors, Fin Field-Effect Transistors (FinFETs), or the like. In accordance with some embodiments of the present disclosure, when the transistors are FinFETs, the corresponding active regions of the FinFETs are semiconductor fins, which have lengthwise directions in the X-directions. In subsequently discussed examples, the semiconductor fins are used as the examples of the active regions of transistors.

Figure 3:
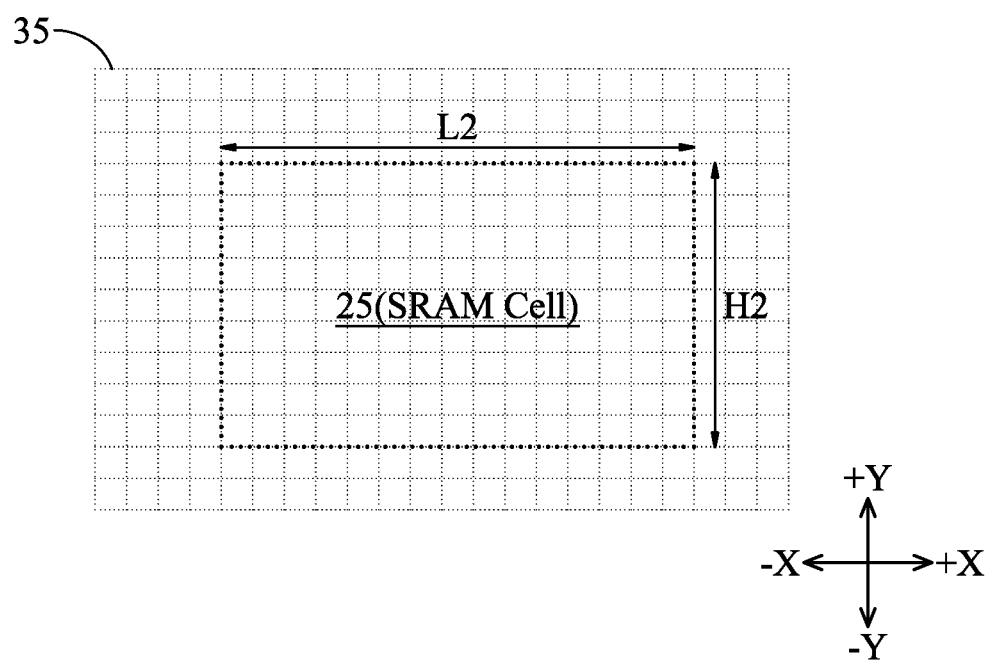
FIG. 3 illustrates boundaries of a memory cell corresponding to a design grid in accordance with some embodiments.

FIG. 3 illustrates the boundaries of SRAM cell 25 relative to grid 35. FIG. 3 shows that the boundaries of SRAM cell 25 also fall on grid lines 34A and 34B of grid 35. Accordingly, the height H2 of standard cell 23 is equal to integer times the grid spacing GS. The height H1 of standard cell 23 may be greater than, equal to, or smaller than the height H2 of SRAM cell 25. Also, the length L2 of SRAM cell 25 is equal to integer times the grid spacing GS. The length L2 may be equal to or different from length L1 of standard cells 23. In accordance with some embodiments, SRAM cell 25 includes transistors therein, which may be planar transistors, FinFETs, or the like. In accordance with some embodiments of the present disclosure, when the transistors are FinFETs, the corresponding active regions of the FinFETs are semiconductor fins, which have lengthwise directions in the X-directions.

Figure 12:
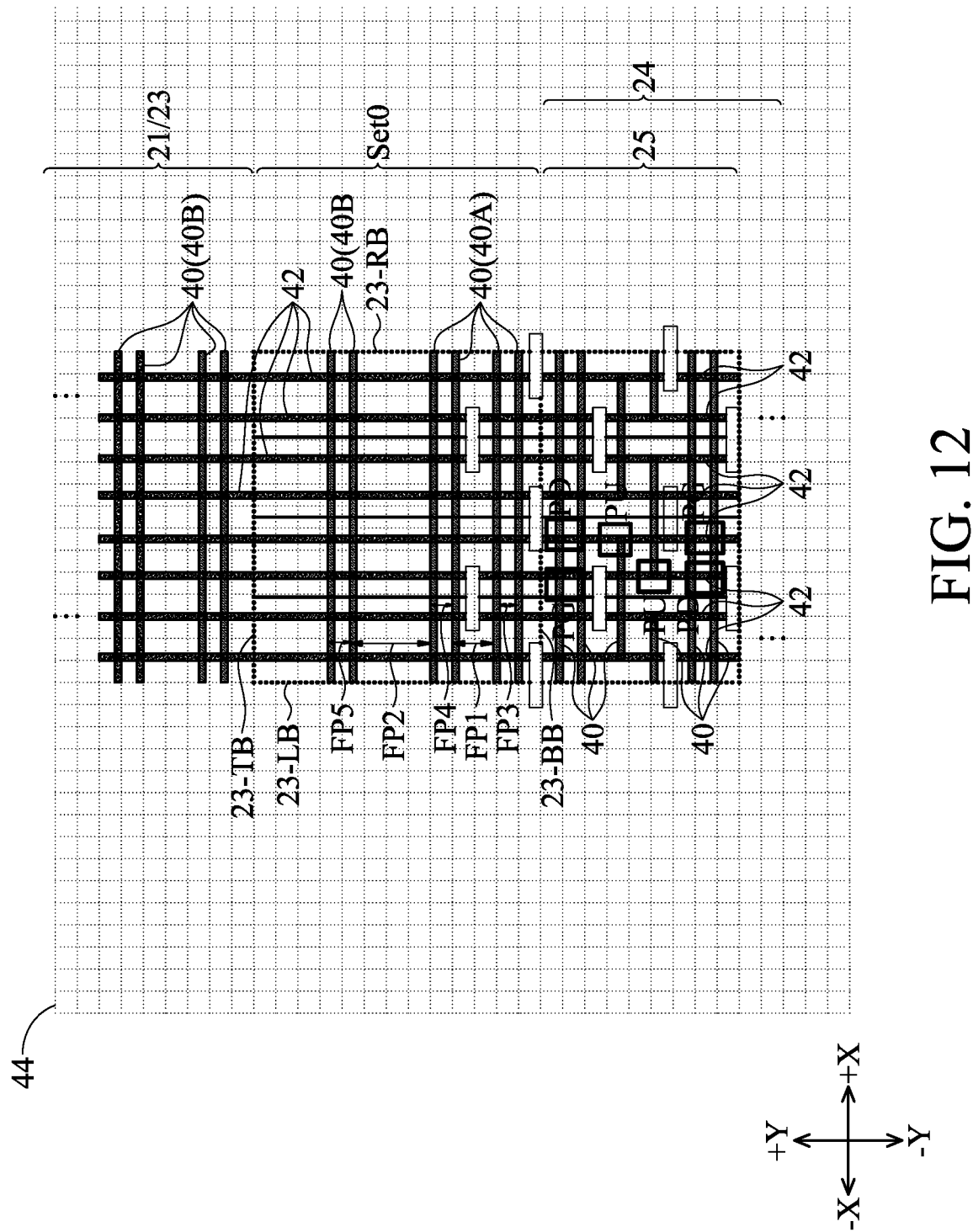
FIGS. 12 through 14 illustrate some details in layouts of some circuits in accordance with some embodiments.

An example of the layout of SRAM cell 25 is shown in FIG. 12, which shows the layout of a six-transistor (6T) SRAM cell 25 in accordance with some embodiments of the present disclosure. The example SRAM cell 25 includes pull-up transistors PU, pull-down transistors PD, and pass-gate transistors PG. The semiconductor fins 40 and gate features 42 are illustrated. Semiconductor fins 40, when manufactured on physical wafers, are semiconductor regions protruding higher than the top surfaces of the surrounding isolation regions (such as Shallow Trench Isolation (STI) regions). It is noted that the illustrated layout shows some (but not all) layers of the layout. For example, some of the layers for cutting the semiconductor fins 40 and gate features 42 are not shown. Accordingly, although semiconductor fins 40 are illustrated as extending from the left boundary to the right boundary of SRAM cell 25, the semiconductor fins 40 in SRAM cell 25 are actually cut apart into shorter portions. Similarly, although gate features 42 are illustrated as extending from the top boundary to the bottom boundary of SRAM cell 25, the gate features 42 may actually be cut apart into shorter portions.

Figure 4:
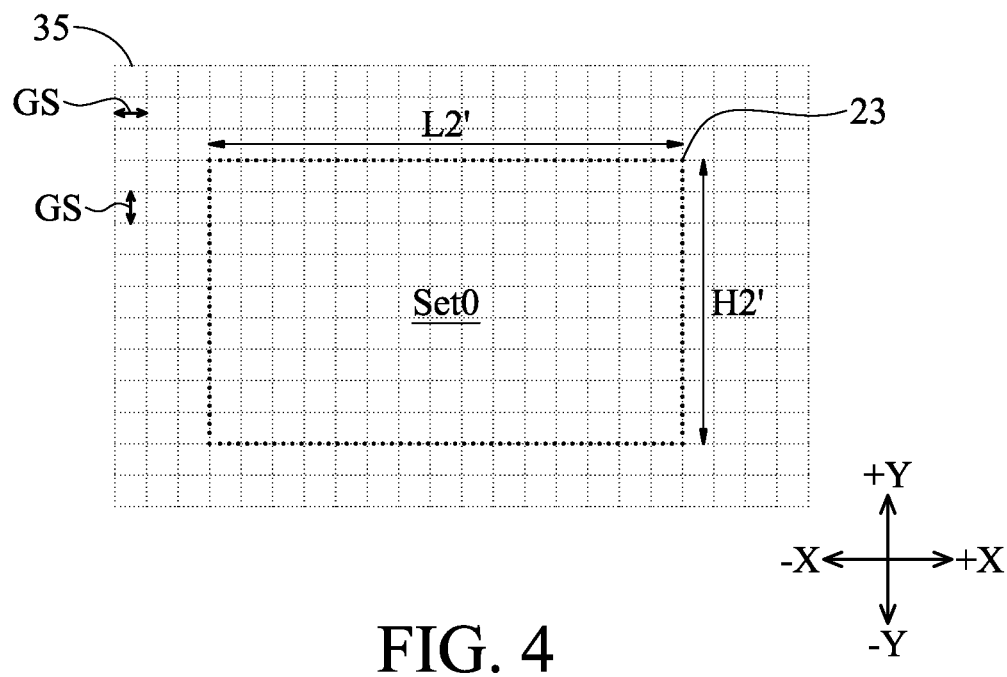
FIGS. 4 through 7 illustrate boundaries of filler cells corresponding to design grids in accordance with some embodiments.

FIG. 4 illustrates the boundaries of filler cell set0 relative to grid 35. Similarly, the boundaries of Filler cell set0 also fall on grid 35. In accordance with some embodiments of the present disclosure, the height H2' of filler cell set0 is equal to height H2 of SRAM cell 25 as shown in FIG. 3, and is also equal to integer times the grid spacing GS. Making height H2' to be equal to H2 may simplify the circuit design without violating design rules and causing process problems when the circuits are implemented on (physical) semiconductor wafers. In accordance with alternative embodiments, height H2' of filler cell set0 is different from (smaller than or greater than) the height H2 of SRAM cell 25 as shown in FIG. 3. In accordance with some embodiments of the present disclosure, the length L2' of filler cell set0 is equal to the length L2 of SRAM cell 25 in FIG. 3 to simplify layout design. In accordance with alternative embodiments of the present disclosure, the length L2' of filler cell set0 is different from the length L2 of SRAM cell 25.

In accordance with some embodiments of the present disclosure, the design of filler cell set0 is customized, and is affected by the design and the layouts of both of the standard cells 23 in standard cell row Srow-A (FIG. 1) and the SRAM cells 25 in SRAM array 24. This means that special filler cell set0 may be needed for each pair of SRAM cells and standard cells that abut with or neighboring the filler cell set0. On the other hand, other filler cells such as what are shown in FIGS. 5 through 7 may or may not be customized according to the design of the neighboring SRAM cells, standard cells, and filler cell set0.

In accordance with some embodiments of the present disclosure, filler cell set0 includes one or more semiconductor fins, and may or may not include the patterns of gate features, which may include gate electrodes, polysilicon strips, metal gates, or the like. Filler cell set0 may also include the dummy features of contact plugs, metal lines, or the like. An example layout of filler cell set0 is shown in FIG. 12, which shows a plurality of semiconductor fins 40 having lengthwise directions in the X-directions and a plurality of gate features 42 having lengthwise directions in the Y-directions. In accordance with some embodiments, some or all of semiconductor fins 40 continuously extend all the way from the left boundary 23-LB to the right boundary 23-RB of filler cell set0. In accordance with alternative embodiments, the semiconductor fins 40 in filler cell set0 may have breaks, and do not continuously extend from the left boundary 23-LB to the right boundary 23-RB. Similarly, some or all of gate features 42 extend all the way from the top boundary 23-TB to the bottom boundary 23-BB of filler cell set0. In accordance with alternative embodiments, gate features 42 may have breaks, and do not extend from the top boundary 23-TB to the bottom boundary 23-BB. The layouts of semiconductor fins and gate features in other filler cells (such as set3, set6, set9, or the like) may or may not continuously extend to the corresponding boundaries.

Figure 5:
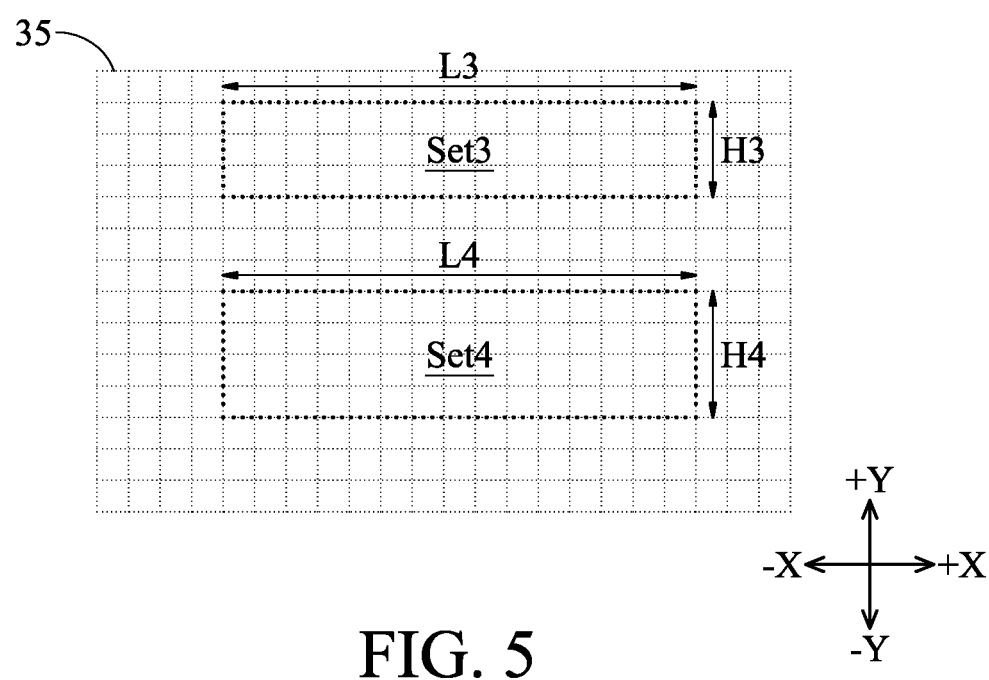
Figure 6:
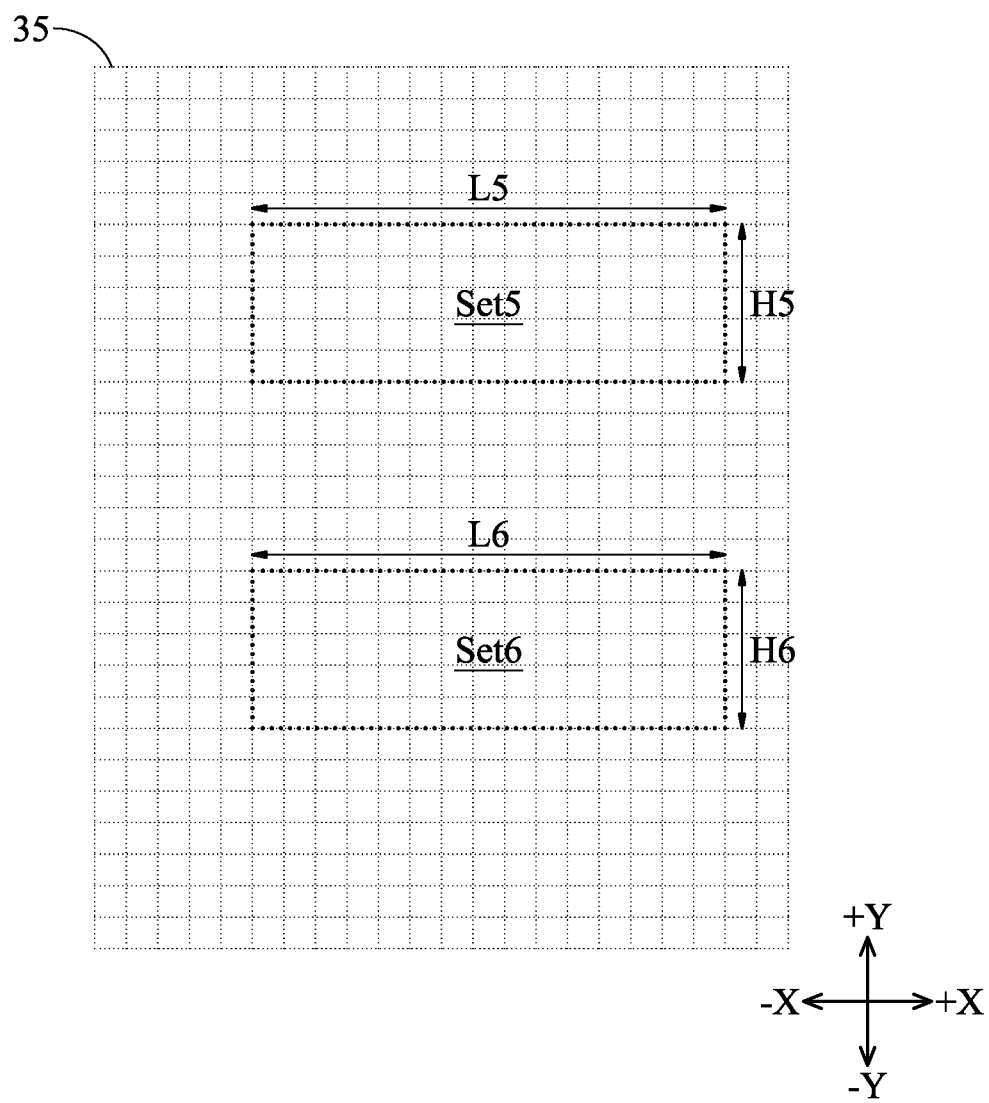
Figure 7:
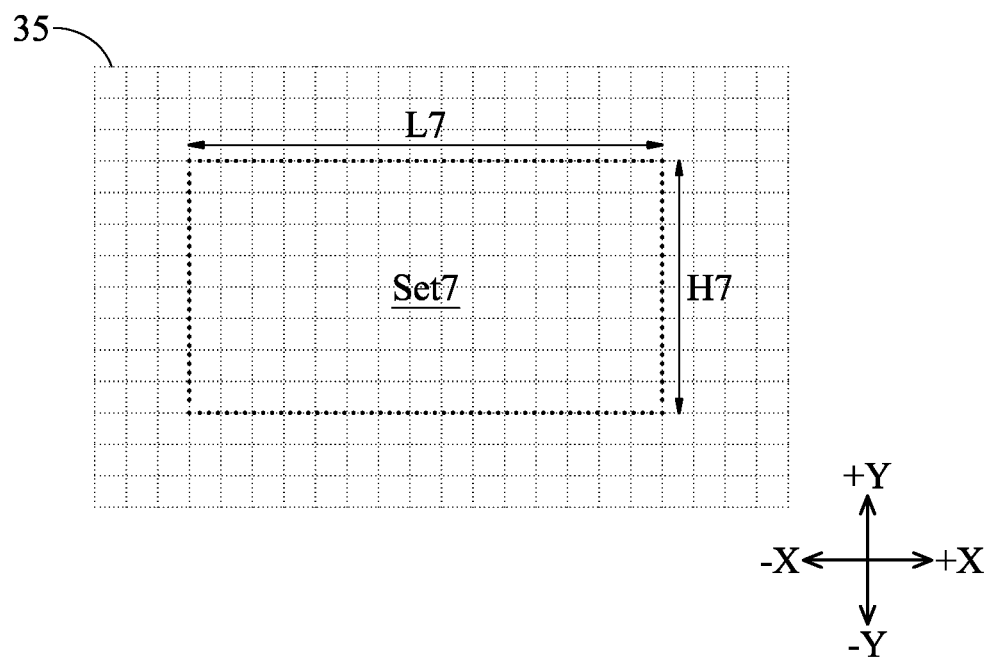

FIGS. 5 through 7 illustrate a plurality of filler cells having different heights. Throughout the description, filler cells are named with the term "set" followed by a number, wherein the number indicates the corresponding height of the corresponding filler cell. For example, filler cells set3, set4, set5, set6, and set7 have heights of 3, 4, 5, 6, and 7, respectively.

FIG. 5 illustrates filler cell set3 in accordance with some embodiments of the present disclosure. The height H3 of filler cell set3 is 3, which means filler cell set3 extends across three grid spacings. The length L3 of filler cell set3 may be equal to the length L2 of SRAM cell 25 (FIG. 3) and/or the length L2' of filler cell set0 (FIG. 4), although length L3 may also be different from lengths L2 and/or L2'.

FIG. 5 also illustrates filler cell set4 in accordance with some embodiments of the present disclosure. The height H4 of filler cell set4 is 4, which means filler cell set4 extends across four grid spacings. The length L4 of filler cell set4 may be equal to the length L2 of SRAM cell 25 (FIG. 3) and/or the length L2' of filler cell set0 (FIG. 4), although length L4 may also be different from lengths L2 and/or L2'.

FIG. 6 illustrate filler cells set5 and set6 in accordance with some embodiments of the present disclosure. The heights of filler cells set5 and set6 are 5 and 6, respectively, and the lengths L5 and L6 may be equal to or different from lengths L2 and/or L2' of filler cells set0.

FIG. 7 illustrates filler cell set7 in accordance with some embodiments of the present disclosure. The height H7 of filler cell set7 is 7, which means filler cell set7 extends across seven grid spacings. The length L7 of filler cell set7 may be equal to the length L2 of SRAM cell 25 (FIG. 3)

and/or the length L2' of filler cell set0 (FIG. 4), although length L7 may also be different from length L2 and/or L2'.

Figure 11:
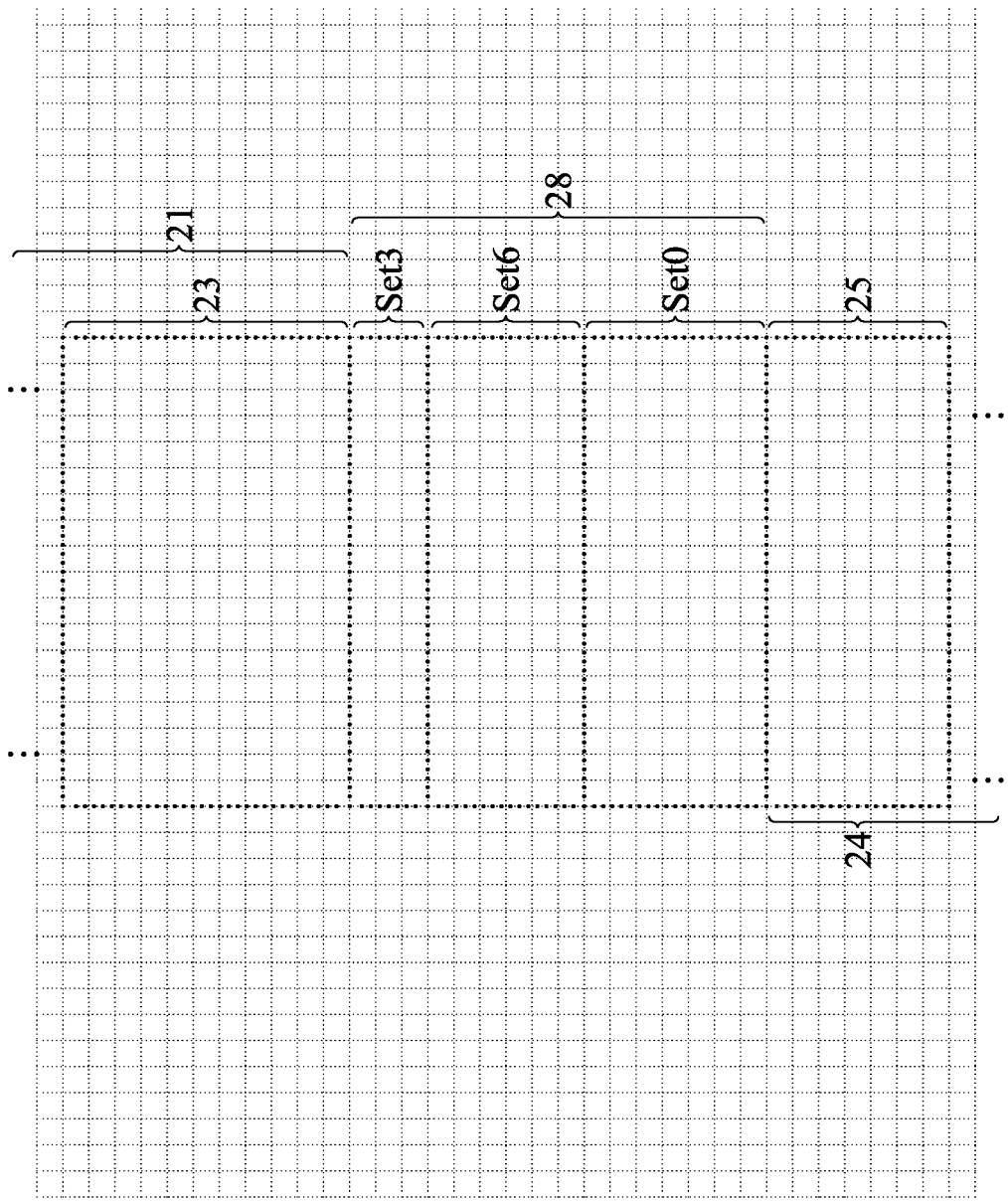
FIG. 11 illustrates the abutting of a standard cell, a filler cell set3, a filler cell set6, a filler cell set0, and a memory cell corresponding to a design grid in accordance with some embodiments.

Similar to the filler cells set3, set4, set5, set6, and set7, more filler cells such as set8, set9, set10, and so on, may be designed, and the heights and lengths of these cells may be similar to filler cells set3 through set7. The tallest filler cell that is designed may have any height greater than 5. In accordance with some embodiments, the tallest filler cell may have a height equal to the height of the tallest standard cell that is to abut with SRAM macro 22. In accordance with some embodiments, filler cells set0, set3, set4, and set5 are designed, and the filler cells with heights greater than filler cell set5 are not designed. In accordance with these embodiments, if a taller filler cell with a height greater than 5 is needed, the filler cell may be made by abutting two or more of the shorter filler cells. For example, if a filler cell with a height of 9 is needed, it may be achieved by abutting set3 with set6, by abutting three set3 cells, or by abutting set4 and set5. An example is shown in FIG. 11, which shows that a set3 and a set6 are abutted to achieve the function of a set9.

It is appreciated that filler cells set1 and set2, which have heights of 1 and 2, respectively, may be needed in circuit design. The design rules, however, may or may not allow the using of filler cells set1 and set2. If filler cells set1 and set2 are allowed, they are also designed. If filler cells set1 and set2 are not allowed, and if the design of a circuit requires a filler cell set1 or filler cell set2 to fit SRAM array, the solution of design and layout is discussed in subsequent paragraphs.

Figure 13:
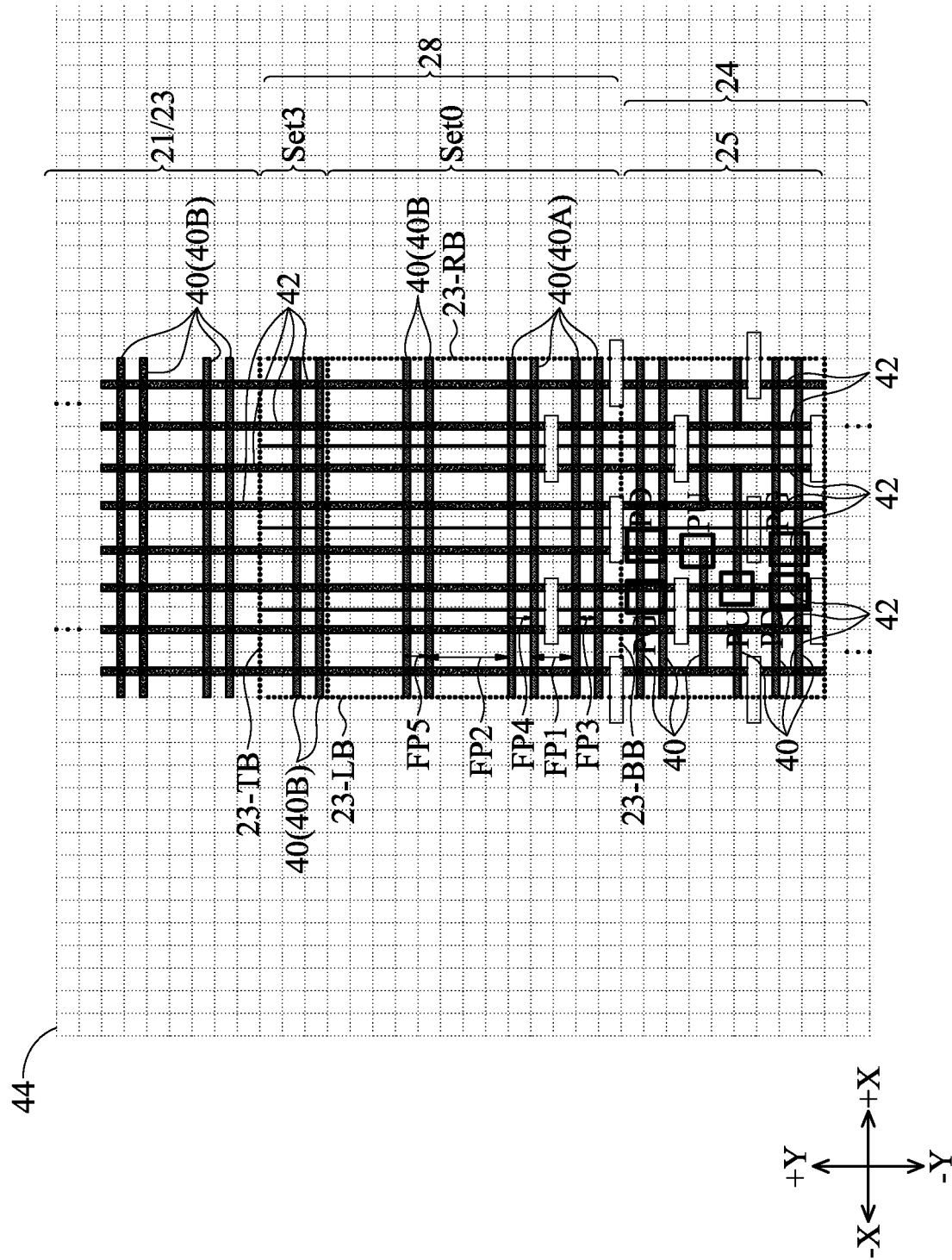
Figure 14:
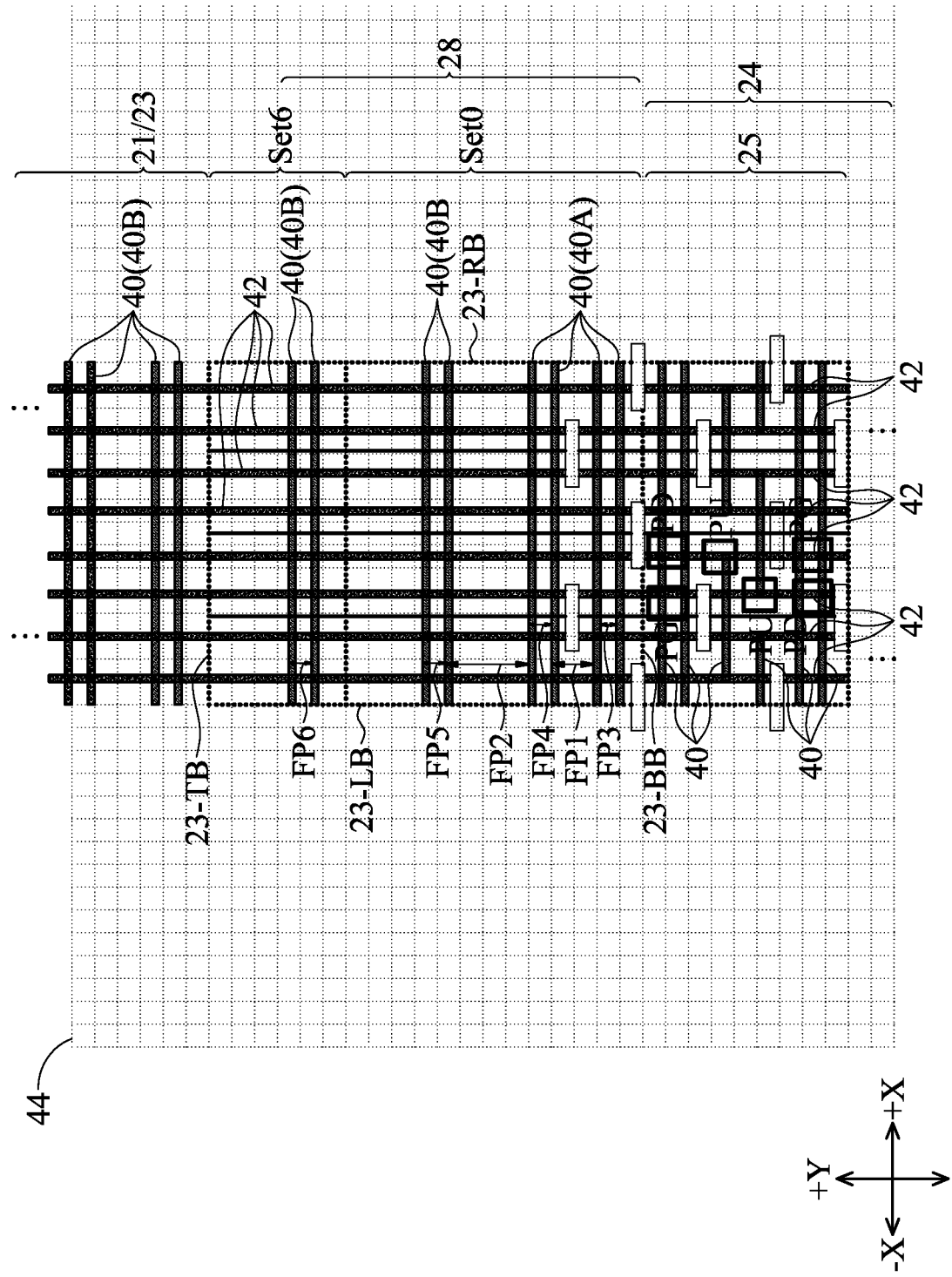

In accordance with some embodiments of the present application, each of filler cells (including set0, set3, set4, set5, and so on) includes at least one, and maybe more, semiconductor fin(s). For example, FIG. 13 illustrates example layouts of filler cells set0 and set3, and FIG. 14 illustrates example layouts of filler cells set0 and set6. Throughout the description, the semiconductor fins 40 having their lengthwise direction aligned to a same straight line (in X-direction) are collective referred to a row of fins or a fin-row. In a filler cell, a fin-row may include a single semiconductor fin, which may or may not extend to the left and right boundaries of the respective filler cell, or may include a plurality of semiconductor fins separated from each other. In accordance with some embodiments, filler cell set0 has a same number of fin-rows as SRAM cell 25. For example, FIGS. 12 through 14 illustrate that both of SRAM cell 25 and filler cell set0 have 6 fin rows. Filler cells set3, set4, set5, and the like may have different number of fin-rows, which may, or may not be related to the height of the corresponding filler cell. For example, both of filler cell set0 and set6 have one semiconductor fin 40. Furthermore, although filler cell set0 may have a same height as SRAM cell 25, the layout of the semiconductor fins 40 and gate features in filler cells set0 and SRAM cell 25 are different from each other. For example, the fin pitches in filler cells set0 may be different from the fin pitches in SRAM cell 25. In accordance with some embodiments, in filler cells set0, the fin pitches FP1 (FIGS. 12 through 14) of some of the fins closer to SRAM cell 25 are smaller than the fin pitches FP2 closer to standard cell 23. In addition, there may be a plurality of fin groups having fin pitch FP3, FP4, FP5, and FP6 equal to each other.

Besides semiconductor fins 40, filler cells set0, set3, set4, and so on may have gate features 42 (referring to FIGS. 12 through 14), which extend in the Y-directions (+Y and −Y directions). The gate features 42 may be continuous, and extend from the top boundary to the bottom boundary of the respective filler cell, or may be broken, with one column of gate features in the same filler cell including a plurality of disconnected gate features. Filler cells may or may not include other features such as dummy contact plugs, dummy metal lines, etc., which are not illustrated. In accordance with some embodiments, some or all of the conductive features including gate features 42, dummy contact plugs, dummy metal lines, etc., are electrically floating. The semiconductor fins in the filler cells are not used for forming active devices and passive devices. Accordingly, the filler cells, from circuit function point of view, are dummy cells since they don't have functions to the logic circuits and SRAM circuits as shown in FIG. 1. Furthermore, the filler cells are electrically and functionally disconnected from both of the surrounding standard cells 23 and the SRAM macro 22.

The standard cells 23, SRAM cells 25, and the filler cells may be pre-designed and laid out, and saved in a cell library for the future pick-and-place into the layouts of the design of chips. With the filler cells designed and stored in a cell library, the filler cells may be used to achieve the circuit design of a circuit as shown in FIG. 1. The circuit design process includes calculating the total height HT3 of the region including SRAM array 24 and filler cell region 28, calculating the total height HT4 of SRAM macro 22, and reserving the chip space for SRAM macro 22.

Furthermore, a design task includes, after the total heights HT4 and HT3 are determined, calculating the minimum height HT2 of filler cell region 28, and selecting appropriate filler cells to form filler cell region 28. In accordance with some embodiments, filler cell set0 is always inserted to satisfy design rules. With filler cell set0 being inserted, more filler cells may be or may not be added, as will be discussed in subsequent paragraphs.

In accordance with some embodiments, the total height HT4 of SRAM macro 22 is equal to integer times the standard cell height H1, which is H1*k, with number k being the number of standard cells corresponding to SRAM macro 22, as shown in FIG. 1. Since peripheral portion 26A are considered as logic cells, the cells of peripheral portion 26A are horizontally aligned to the rows of standard cells 23 in standard cell region 21. Accordingly, the top boundary of the top row of the cells in peripheral portion 26A is level with a top boundary of one row of standard cells 23, as indicated by dashed line 32. Alternatively stated, the bottom boundary of SRAM array 24 is level with a bottom boundary of one row (Srow-n) of standard cells 23. Furthermore, the top boundary of filler cell region 28 needs to be level with the bottom boundary of standard cell row Srow-A. This means that the total height HT3, which is the total height of the combined region of SRAM array 24 and filler cell region 28, needs to be equal to the integer times the standard cell height H1, and equal to n*H1 (with H1 being the standard cell height). The height HT2 of filler cell region 28 is selected to satisfy this requirement.

As shown in FIG. 1, the following equation holds:

$$HT2 = HT3 - HT1 \qquad [\text{Eq. 1}]$$

Wherein the height HT1 is the total height of SRAM array 24, the height HT2 is the total height of filler cell region 28. The total height HT1 of SRAM array 24 is equal to m*H2, wherein height H2 is the cell height of memory cells 25, as shown in FIG. 3. Accordingly, the required height HT2 of filler cell region 28 may be calculated as:

$$HT2 = n*H1 - m*H2 \qquad [\text{Eq. 2}]$$

Figure 8:
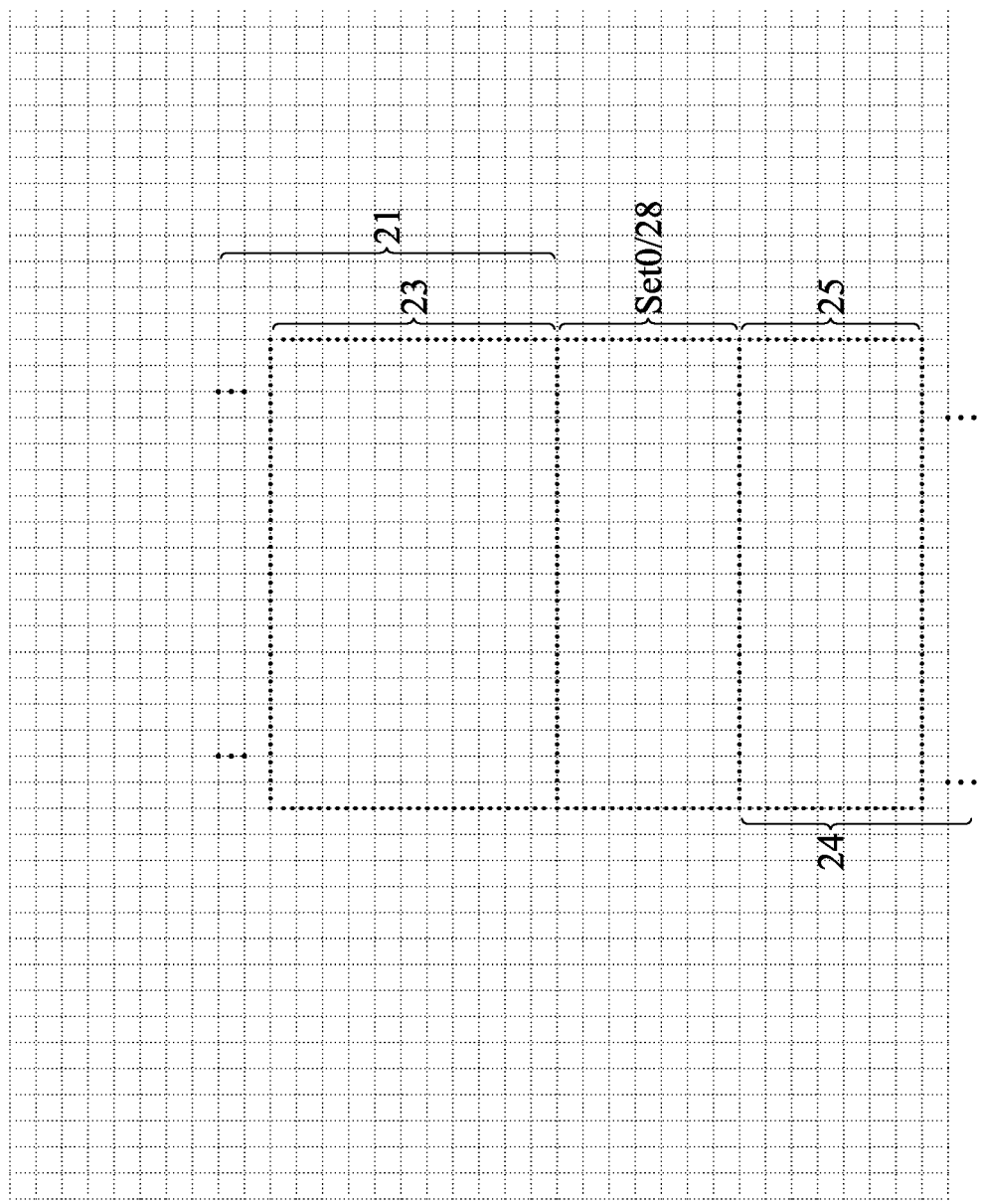
FIG. 8 illustrates the abutting scheme of a standard cell, a filler cell set0, and a memory cell corresponding to a design grid in accordance with some embodiments.

With height HT2 being obtained from Equation 2, the filler cells in filler cell region 28 can be selected so that the total height of the filler cells is equal to HT2. In accordance with some embodiments, HT2 happens to be equal to height H2' (FIG. 4, wherein H2' may be equal to height H2 of SRAM cell 25). This means that when filler cell region 28 includes only one row of filler cells set0, the top edge of filler cell set0 happens to be level with the top edge of standard cell row Srow-1, and no more filler cell is needed. The resulting layout is shown in FIG. 8, which shows that filler cell set0 is between, and abuts both of, standard cell 23 and SRAM cell 25. With this structure, filler cell set0 alone mitigates the structure difference between standard cell 23 and SRAM cell 25, and is used as a buffer between standard cell 23 and SRAM cell 25, so that the spacing between standard cell 23 and SRAM cell 25 is minimized without violating design rules.

Figure 9:
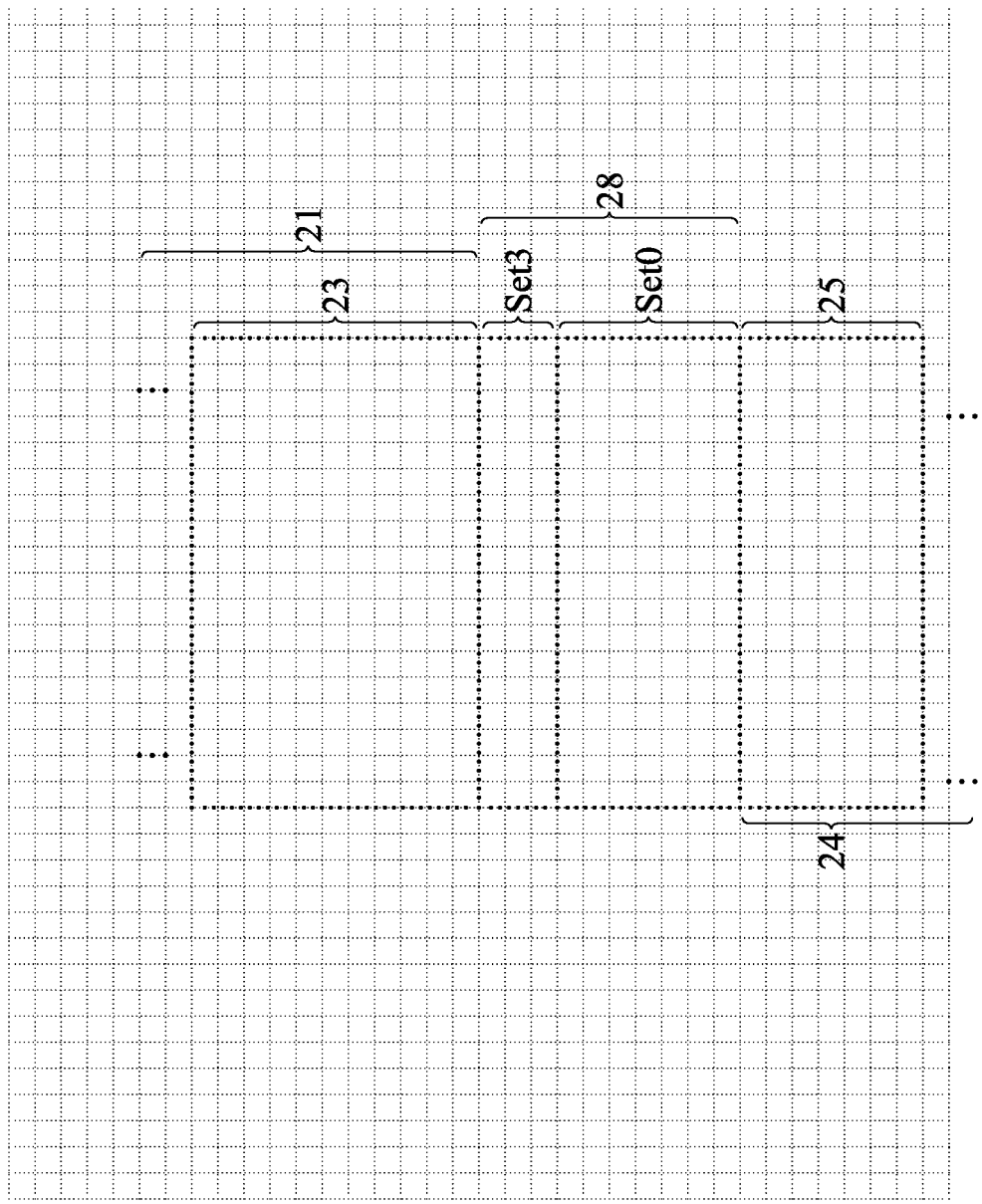
FIG. 9 illustrates the abutting scheme of a standard cell, a filler cell set3, a filler cell set0, and a memory cell corresponding to a design grid in accordance with some embodiments.
Figure 10:
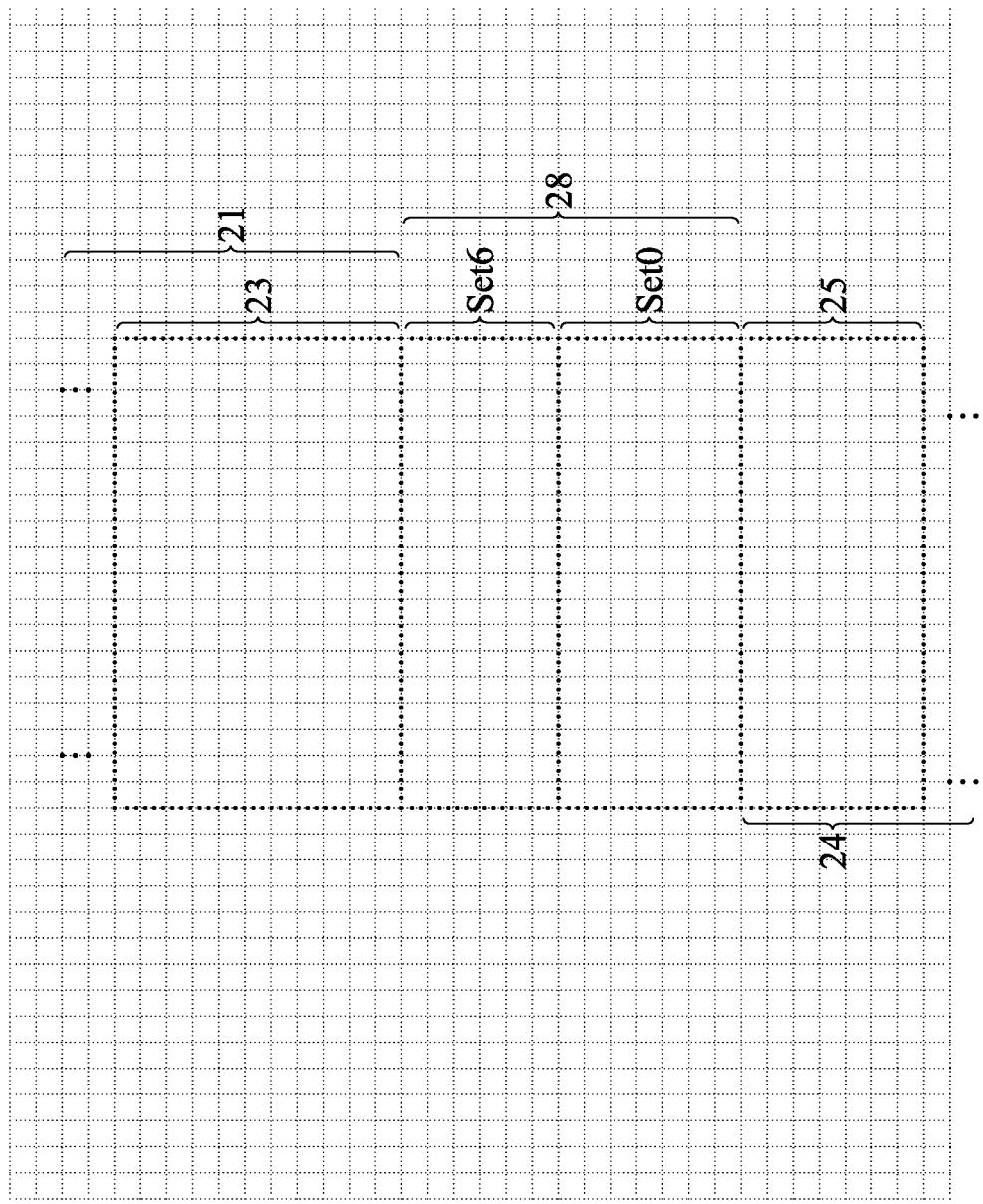
FIG. 10 illustrates the abutting scheme of a standard cell, a filler cell set6, a filler cell set0, and a memory cell corresponding to a design grid in accordance with some embodiments.

If, however, height HT2 is greater than the height H2 (or H2') of filler cell set0 by different ΔH, more filler cells need to be inserted to ensure that the total height HT3 is equal to integer times the standard cell height. For example, assuming the difference ΔH is equal to 3, 4, 5, or more, a corresponding filler cell(s) with the corresponding height is selected to compensate for the difference. For example, FIG. 9 illustrates an embodiment in which ΔH is equal to 3. Accordingly, filler cell set3 is inserted on top of filler cell set0. FIG. 10 illustrates another example, in which ΔH is equal to 6, and filler cell set6 is inserted on top of filler cell set0. In accordance with alternative embodiments, two filler cells set3 may be used to replace filler cell set6. FIG. 11 illustrates yet another embodiment, in which ΔH is equal to 9, and filler cells set3 and set6 are added on top of filler cell set0. It is appreciated that the order of filler cells may be inversed. For example, filler cell set6 may be placed on top of, rather than below, filler cell set3. The height difference ΔH of 9 may also be achieved using filler cells set4 and set5.

When difference ΔH is equal to 1 or 2, if filler cells set1 and set2 are allowed by design rules, filler cells set1 and set2 are designed and used to make up the height difference similar to what are discussed in preceding paragraphs. Filler cells set1 and set2, however, may not be allowed due to design rule violation, and are not available in the cell library. In this case, referring to FIG. 1, SRAM array 24 may be moved down by one standard cell row. For example, the bottom boundary of SRAM array 24 may be moved down from the level as shown by dashed line 32 to the level as shown by dashed line 33. As a result, the top boundary of SRAM array 24 is also moved down by one row of standard cells. The height HT2 is thus increased by height H1 of standard cell 23. Accordingly, the new height difference ΔH' is now (ΔH+H1), which is adequate for allocating appropriate filler cells set0 and additional filler cells. For example, assuming before the SRAM array 24 is moved down, the height difference ΔH is equal to 2, and standard cell height H1 is 15, by moving SRAM array 24 down, the height difference is increased to 2+15, which is 17, which may be achieved by selecting from a plurality of available filler cell combinations such as set6+set6+set5, set4+set4+set4+set5, or the like.

There may be some special situations, in which the design may be simpler. For example, if the cell height H1 of standard cell 23 and the cell height H2 of SRAM cell 25 has a common factor, the design may be simplified by designing and using the filler sets having the heights equal to the common factor and/or the multiples of the common factor. For example, assuming cell height H1 of standard cell 23 is equal to 15, and the cell height H2 of SRAM cell 25 is equal to 9, then the following equation exists:

$$15*n=9*(m+1)+\Delta H \quad [\text{Eq. 3}]$$

Wherein n is the number of rows of standard cells (FIG. 1), (m+1) is the number of rows of SRAM cells in SRAM array 24 plus filler cell set0, and the remainder (which is height difference ΔH) is the total height of extra filler cells needed in filler cell region 28. Clearly, when the common factor is 3, ΔH is the integer times of 3 such as 0, 3, 6, 9, 12, 15, or the like. Accordingly, common-factor filler cells set3, set6, set9, set12, set15 and the like are used. These filler cells are enough to handle all situations, and other filler cells such as filler cells set4, set5, set7, set8, and the like are not needed. Therefore, in accordance with some embodiments, filler cell set3 is used, while other filler cells set6, set9, set12, set15, and the like are not used since two or more of filler cells set3 may be abutted to make up the required height difference 6, 9, 12, 15, or the like. In accordance with other embodiments, filler cell set3, set6, set9, set12, set15, and the like are designed and used, while other non-common-factor cells such as filler cells set4, set5, set7, and the like are not formed and used.

Similarly, the common factor of heights H1 and H2 may be equal to 4, for example, when height H1 is equal to 12 and height H2 is equal to 8. Correspondingly, according to Equation 3, the remainder (height difference ΔH) is equal to the integer times of 4 (2 is not an available common factor since set2 may not be allowed). Accordingly, filler cells set4, set8, set12, and the like are designed and used, while other non-common-factor cells such as filler cells set3, set5, set7, and the like are not formed and used. In a simpler design, filler cell set4 is used, while other filler cells (including both of common-factor cells and non-common-factor cells) are not used since two or more of filler cells set4 may be abutted to make up the required height difference ΔH. It is realized that when the common factor is 5, for example, when height H1 is 15, and height H2 is 10, filler cell set5 or filler cells set5, set10, etc. may be used, while other types of filler cells such as set3, set4, etc. may not be needed.

FIGS. 12, 13, and 14 illustrate some example layouts. The relative fin positions and fin pitches in SRAM cell 25, filler cells set0, set3, and set6, and standard cell 23 may also be found in these figures in accordance with some embodiments. In each of FIGS. 12, 13, and 14, one column of cells is illustrated, and the circuit includes a plurality of columns of cells. Furthermore, the plurality of filler cells in a same row may be identical to each other. In addition, when filler cells have the same lengths (for example, length L2' and L3 through L7 in FIGS. 4 through 7) as the length L2 of SRAM cell 25 in FIG. 3, the left and right boundaries of filler cells may be flushed with the corresponding left and right boundaries of SRAM cells. The total number of filler cells in a same row may also be the same as the total number of SRAM cells in a same row, and the total numbers of the filler cells and the SRAM cells may be equal to the total column number. When the filler cells in the same row are laid out, they may be laid out in the same orientation, or, neighboring filler cells in different columns may be flipped relative to each other. In accordance with some embodiments of the present disclosure, the semiconductor fins 40 in the filler cells in the same row of the filler region are connected to form a continuous fin, which has a same length as a row of the SRAM array 24 (FIG. 1).

FIG. 12 illustrates an example layout of a portion 44 of the circuit in FIG. 1. The boundaries of cells are shown with dashed lines. This example includes some parts of the layouts of SRAM cell 25, filler cell set0, and standard cell 23. It is noted that in the illustrated example, the height of filler cell set0 is not equal to the height of SRAM cell 25, while in the examples according to other embodiments, filler cell set0 and SRAM cell 25 may have their heights to be equal to each other. The examples of fins 40 and gate features 42 are also shown. Some (and not all) of cut regions, used for cutting gate features 42 are also shown. The cut regions, in which fins 40 and gate features 42 are cut apart, are not shown, and one of ordinary skill in the art will realized the layouts of standard cells and SRAM cells.

FIG. 13 also illustrates an example layout of the portion 44 of the circuit in FIG. 1. This figure is similar to the figure shown in FIG. 12, except that filler cell set3 is added as a part of filler cell region 28.

FIG. 14 illustrates an example layout of a portion of the circuit in FIG. 1. This figure is similar to the figure shown in FIG. 12, except that the set6 is added as a part of filler cell region 28. In FIGS. 12, 13, and 14, the illustrated long semiconductor fins 40 and gate features in filler cells set0, set3, and set6 may be cut into shorter portions, and may remain uncut.

Figure 15:
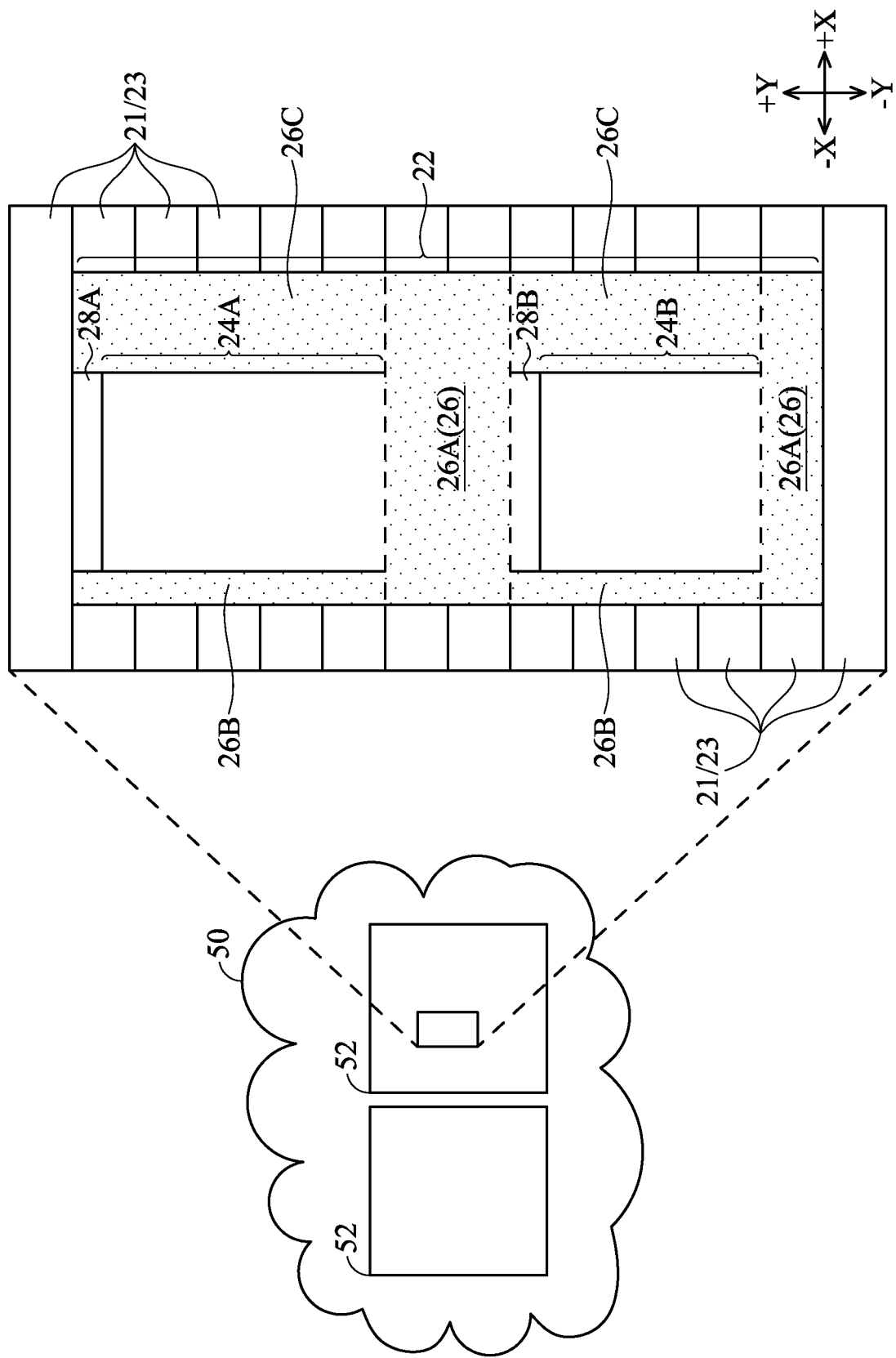
FIG. 15 illustrates device regions of a circuit including two memory arrays in accordance with some embodiments.

FIG. 15 illustrates an embodiment in which two SRAM arrays are formed in the SRAM macro 22. Accordingly, two filler cell regions 28A and 28B are formed. The filler cell region 28A is between the standard cells in an overlying row in standard cell region 21 and SRAM array 24A, and filler cell region 28B is between SRAM peripheral region 26A and SRAM array 24B.

The layouts of the circuits and cells as aforementioned may be in the form of electronic data, which may be stored in a tangible storage such as a hard disk. The layouts may also be printed on physical media such as paper. After the layout of the circuit as shown in FIG. 1 are laid out, a manufacturing process is performed to implement the design on a physical wafer (e.g., see wafer 50 of FIG. 15) on which the circuits as shown in FIGS. 1 through 15 are formed. The wafer is then sawed into chips (e.g., see first chip 52a and second chip 52b of FIG. 15, collectively referred to as chips 52), and the chips accordingly include the circuits as shown in FIGS. 1 through 15.

Figure 16:
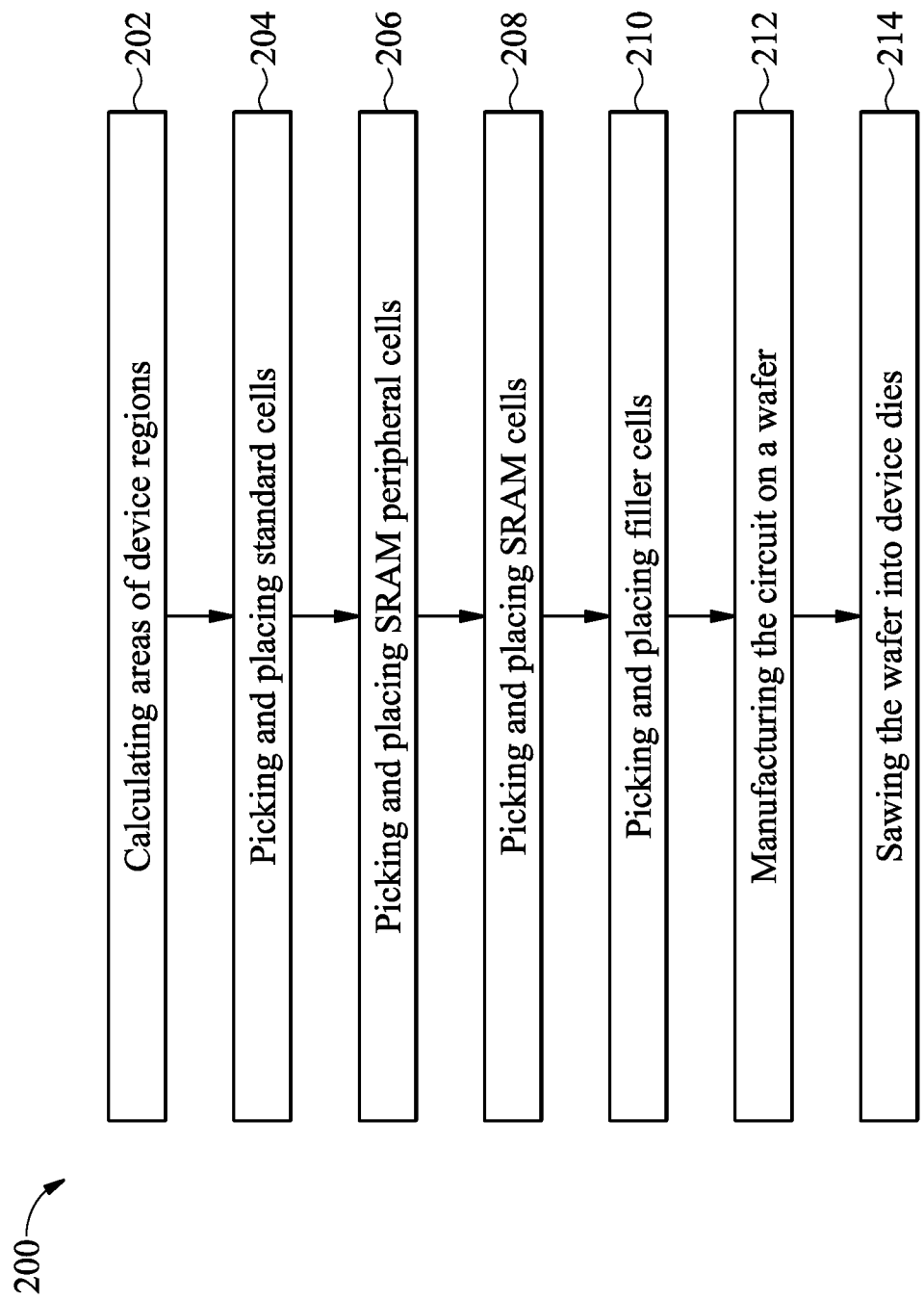
FIG. 16 illustrates a process flow for designing a circuit in accordance with some embodiments.

FIG. 16 illustrates a process flow 200 in the designing and manufacturing of the circuit including standard cells and SRAM cells. In accordance with some embodiment, the design includes calculating the areas (including heights and widths) of device regions including standard cell region 21, SRAM macro 22, SRAM array 24, and filler region 28, so that that chip areas may be reserved for these regions. The respective process is illustrated as process 202 in the process flow shown in FIG. 16. The design of the layout further includes picking-and-placing standard cells 23 to lay out standard cell region 21 (process 204 in FIG. 16), picking-and-placing cells for the SRAM peripheral region 26 (process 206 in FIG. 16), picking-and-placing SRAM cells to layout SRAM array 24 (process 208 in FIG. 16), selecting appropriate filler cells, and picking-and-placing the selected filler cells to layout filler cell region 28 (process 210 in FIG. 16). The circuit is then manufactured on a physical wafer (such as wafer 50 of FIG. 15, process 212 in FIG. 16), which is then sawed into singulated chips (such as chips 50 of FIG. 15, process 212 in FIG. 16). In the resulting layout, the spacing between SRAM array and the nearest standard cell row Srow-A is minimized. Accordingly, the chip area is saved, and the efficiency in the chip area usage is improved.

The embodiments of the present disclosure have some advantageous features. By inserting appropriate filler cells between standard cells and an SRAM array, the chip area is saved compared to conventional circuits in which large white spaces need to be inserted between standard cells and the SRAM array. This provides a technical solution for solving the chip-area-waste problem. The filler cells may have a minimal total height to maximize the benefit in the saving of chip area. A method of calculating the needed filler cells and selecting the filler cells is also provided.

In accordance with some embodiments of the present disclosure, a method comprises laying out a standard cell region, with a rectangular space being within the standard cell region, wherein the standard cell region comprises a first row of standard cells having a first bottom boundary facing the rectangular space; and a plurality of standard cells having side boundaries facing the rectangular space, wherein the plurality of standard cells comprise a bottom row of standard cells; laying out a memory array in the rectangular space, wherein a second bottom boundary of the bottom row and a third bottom boundary of the memory array are aligned to a same straight line; and laying out a filler cell region in the rectangular space, wherein the filler cell region comprises a first top boundary contacting the first bottom boundary of the first row of standard cells; and a fourth bottom boundary contacting a second top boundary of the memory array. In an embodiment, the method further comprises manufacturing the standard cell region, the memory array, and the filler cell region on a wafer. In an embodiment, the laying out the filler cell region comprises laying out a first filler cell having a same height as a memory cell in the memory array. In an embodiment, the first filler cell comprises a first part of the first top boundary contacting the first bottom boundary of the first row of standard cells; and a second part of the fourth bottom boundary contacting the second top boundary of the memory array. In an embodiment, the standard cell region, the memory array, and the filler cell region have boundaries falling on grid lines of a grid, and the laying out the filler cell region further comprises laying out a second filler cell between, and in contact with, the first filler cell and the first row of standard cells. In an embodiment, the second filler cell has a height equal to three grid spacings. In an embodiment, the laying out the filler cell region further laying out a third filler cell between the second filler cell and the first row of standard cells. In an embodiment, the first row of standard cells have a first cell height, and memory cells in the memory array has a second height, with the first cell height and the second height having a common factor, and wherein the method further comprises laying out a plurality of filler cells having different cell heights, with the different cell heights being equal to integer times of the common factor. In an embodiment, the laying out the memory array comprises laying out Static Random Access Memory (SRAM) cells. In an embodiment, filler cells in the filler cell region have no electrical functions.

In accordance with some embodiments of the present disclosure, a method comprises laying out a row of standard cells; laying out a Static Random Access Memory (SRAM) array; and laying out a row of filler cells between the row of standard cells and the SRAM array, wherein the row of filler cells have a height equal to a height of an SRAM cell in the SRAM array, and wherein the row of filler cells contacts both of the row of standard cells and the SRAM array. In an embodiment, the row of filler cells are non-SRAM cells. In an embodiment, the method further comprises laying out a plurality of rows of standard cells, wherein the plurality of rows of standard cells have portions on opposite sides of the SRAM array, wherein the SRAM array has a first bottom boundary aligned with a second bottom boundary of one of the plurality of rows of standard cells. In an embodiment, the laying out the row of filler cells comprises laying out semiconductor fins, and wherein the semiconductor fins extend from a first boundary to an opposing second boundary of corresponding filler cells in the row of filler cells. In an embodiment, the laying out the row of filler cells comprises aligning first opposing boundaries of the row of filler cells with corresponding second opposing boundaries of columns of SRAM cells.

In accordance with some embodiments of the present disclosure, a method comprises laying out a standard cell having a first cell height; laying out a memory cell having a second cell height; calculating a common factor between the first cell height and the second cell height; laying out a first filler cell having the second cell height; laying out a plurality of second filler cells having cell heights different from each other, with the cell heights being equal to integer times of the common factor; and storing the standard cell, the memory cell, the first filler cell, and the plurality of second filler cells in a cell library. In an embodiment, the method further comprises laying out a circuit comprising laying out a row of standard cells comprising the standard cell; laying out a memory array comprising a plurality of memory cells having a same layout as the memory cell; and laying out a first row of filler cells between the row of standard cells and the memory array, wherein the first row of filler cells have a first layout same as the first filler cell. In an embodiment, the method further comprises laying out a second row of filler cells between the row of standard cells and the first row of filler cells, wherein the second row of filler cells have a second layout same as one of the plurality of second filler cells. In an embodiment, the method further comprises manufacturing the circuit on a physical wafer. In an embodiment, the common factor is three, and the cell heights different from each other include a cell height of 3, a cell height of 6, and a cell height of 9.

In accordance with some embodiments of the present disclosure, a structure comprises a plurality of standard cells forming a standard cell row; an SRAM array; and a plurality of filler cells forming a filler cell row between the standard cell row and the SRAM array, wherein the plurality of filler cells have a first height equal to a second height of an SRAM cell in the SRAM array, and wherein top boundaries of the plurality of filler cells are in contact with bottom boundaries of the plurality of standard cells, and bottom boundaries of the plurality of filler cells are in contact with top boundaries of the SRAM array. In an embodiment, the plurality of filler cells have identical layouts, and have lengths equal to lengths of SRAM cells in the SRAM array. In an embodiment, the plurality of filler cells are dummy cells electrically disconnected from both of the plurality of standard cells and the SRAM array. In an embodiment, each of the plurality of filler cells comprises a semiconductor fin extending from a left boundary to a right boundary of a respective cell of the plurality of filler cells. In an embodiment, semiconductor fins in the plurality of filler cells are connected to form a continuous fin, and the continuous fin has a length equal to a total length of all SRAM cells in a row of the SRAM array. In an embodiment, each of the plurality of filler cells comprises a plurality of semiconductor fins, and first neighboring fins closer to the plurality of standard cells have a first pitch, and second neighboring fins closer to the SRAM array have a second pitch smaller than the first pitch.

In accordance with some embodiments of the present disclosure, a structure includes an SRAM cell having a first length and a first height; a first filler cell having a second length equal to the first length, and a second height equal to the first height, wherein the first filler cell comprises a first plurality of semiconductor fins, each extending from a first boundary to a second boundary of the first filler cell; and a standard cell, with the first filler cell being between the SRAM cell and the standard cell. In an embodiment, the structure further comprises a second filler cell between the first filler cell and the standard cell, wherein the second filler cell comprises a second plurality of semiconductor fins, each extending from a third boundary to an opposing fourth boundary of the second filler cell. In an embodiment, the first filler cell comprises a first fin group and a second fin group, with first neighboring fins in the first fin group having a same spacing as second neighboring fins in the second fin group, and wherein fin groups closer to the standard cell are spaced further apart from each other than fin groups closer to the SRAM cell. In an embodiment, the first filler cell physically joins both of the SRAM cell and the standard cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first chip and a second chip on a wafer, the first chip comprising:
      a standard cell region, with a rectangular space being within the standard cell region, wherein the standard cell region comprises:
         a first row of standard cells having a first bottom boundary facing the rectangular space; and
         a plurality of standard cells having side boundaries facing the rectangular space, wherein the plurality of standard cells comprise a bottom row of standard cells;
      a memory array in the rectangular space, wherein a second bottom boundary of the bottom row and a third bottom boundary of the memory array are aligned to a same straight line; and
      a filler cell region in the rectangular space, wherein the filler cell region comprises:
         a first top boundary contacting the first bottom boundary of the first row of standard cells; and
         a fourth bottom boundary contacting a second top boundary of the memory array; and
   sawing the wafer to separate the first chip from the second chip.

2. The method of claim 1, wherein the filler cell region comprises a plurality of filler cells aligned to a row, and wherein each of the plurality of filler cells comprises a semiconductor fin parallel to the top boundary.

3. The method of claim 1, wherein the filler cell region comprises a first filler cell having a same height as a memory cell in the memory array.

4. The method of claim 3, wherein the first filler cell comprises:
   a first part of the first top boundary contacting the first bottom boundary of the first row of standard cells; and
   a second part of the fourth bottom boundary contacting the second top boundary of the memory array.

5. The method of claim 1, wherein the filler cell region comprises a row of filler cells, and wherein all of filler cells in the row of filler cells are identical to each other.

6. The method of claim 1, wherein the first row of standard cells have a first cell height, and memory cells in the memory array have a second cell height, with the first cell height and the second cell height having a common factor.

7. The method of claim 1, wherein the memory array comprises Static Random Access Memory (SRAM) cells.

8. The method of claim 1, wherein filler cells in the filler cell region have no electrical functions.

9. A method comprising:
forming a first chip and a second chip on a wafer, the first chip comprising:
a row of standard cells;
a Static Random Access Memory (SRAM) array; and
a row of filler cells between the row of standard cells and the SRAM array, wherein the row of filler cells have a first height equal to a second height of an SRAM cell in the SRAM array, and wherein the row of filler cells contacts both of the row of standard cells and the SRAM array; and
sawing the wafer to separate the first chip from the second chip.

10. The method of claim 9, wherein the row of filler cells are non-SRAM cells.

11. The method of claim 9 further comprising:
a plurality of rows of standard cells having portions on opposite sides of the SRAM array, wherein the SRAM array has a first bottom boundary aligned with a second bottom boundary of one of the plurality of rows of standard cells.

12. The method of claim 9, wherein the row of filler cells comprise semiconductor fins, and wherein one of the semiconductor fins continuously extends from a first boundary to an opposing second boundary of the row of filler cells, and wherein the first boundary is aligned to a third boundary of the SRAM array to form a first straight boundary, and the opposing second boundary is aligned to a fourth boundary of the SRAM array to form a second straight boundary.

13. The method of claim 9, wherein each of filler cells in the row of filler cells comprises first opposing boundaries vertically aligned with corresponding second opposing boundaries of one of columns of SRAM cells.

14. A method comprising:
forming a first chip and a second chip on a wafer, the first chip comprising:
a standard cell having a first cell height;
a memory cell having a second cell height;
a filler cell between the standard cell and the memory cell, wherein the filler cell abuts both of the standard cell and the memory cell, and wherein the filler cell comprises a first semiconductor fin; and
sawing the wafer to separate the first chip from the second chip.

15. The method of claim 14 further comprising:
a row of standard cells comprising the standard cell;
a memory array comprising a plurality of memory cells having a same layout as the memory cell; and
a row of filler cells between the row of standard cells and the memory array, wherein the row of filler cells have a first layout same as the filler cell, and wherein the first semiconductor fins in the row of filler cells are interconnected to form a continuous semiconductor fin.

16. The method of claim 14, wherein the filler cell further comprises a second semiconductor fin parallel to the first semiconductor fin.

17. The method of claim 14, wherein the filler cell further comprises a gate stack crossing the first semiconductor fin, wherein the gate stack is electrically floating.

18. The method of claim 17, wherein the gate stack extends to both of a first boundary of the stand cell and a second boundary of the filler cell.

19. The method of claim 5, wherein the row of filler cells comprise a continuous semiconductor fin continuously extending into all of the row of filler cells.

20. The method of claim 19, wherein the row of filler cells comprise a plurality of semiconductor fins, and wherein all of the plurality of semiconductor fins extend into all of the row of filler cells.

* * * * *